(12) United States Patent
Kwon

(10) Patent No.: US 11,244,885 B2
(45) Date of Patent: Feb. 8, 2022

(54) SEMICONDUCTOR PACKAGE SYSTEM

(71) Applicant: Samsung Electronics Co., Ltd., Suwon-si (KR)

(72) Inventor: Heungkyu Kwon, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/573,107

(22) Filed: Sep. 17, 2019

(65) Prior Publication Data
US 2020/0091030 A1 Mar. 19, 2020

(30) Foreign Application Priority Data

Sep. 18, 2018 (KR) .................. 10-2018-0111677
May 9, 2019 (KR) .................. 10-2019-0054538

(51) Int. Cl.
| H01L 23/367 | (2006.01) |
| H01L 21/48 | (2006.01) |
| H01L 25/18 | (2006.01) |
| H01L 25/065 | (2006.01) |

(52) U.S. Cl.
CPC ...... *H01L 23/3675* (2013.01); *H01L 21/4882* (2013.01); *H01L 25/0655* (2013.01); *H01L 25/18* (2013.01)

(58) Field of Classification Search
CPC .............. H01L 25/0655; H01L 25/105; H01L 21/4878; H01L 21/4882; H01L 23/10; H01L 23/3675
See application file for complete search history.

(56) References Cited

U.S. PATENT DOCUMENTS

| 6,222,259 | B1 | 4/2001 | Park et al. |
| 7,250,676 | B2 | 7/2007 | Wang |
| 7,258,808 | B2 | 8/2007 | Kwon et al. |
| 8,541,876 | B2 | 9/2013 | Lu et al. |
| 8,780,561 | B2 | 7/2014 | Danello et al. |
| 8,981,554 | B2 | 3/2015 | Kim |
| 9,460,982 | B2 | 10/2016 | Kourakata et al. |
| 9,595,506 | B2 | 3/2017 | Chen et al. |
| 9,595,514 | B2 | 3/2017 | Bruno et al. |
| 9,735,082 | B2 | 8/2017 | Hung et al. |
| 2002/0121683 | A1 | 9/2002 | Kelly et al. |
| 2005/0189634 | A1 | 9/2005 | Wakiyama et al. |

(Continued)

FOREIGN PATENT DOCUMENTS

| JP | 3573135 B2 | 10/2004 |
| JP | 2008-0305838 A | 12/2008 |

(Continued)

*Primary Examiner* — Vongsavanh Sengdara
(74) *Attorney, Agent, or Firm* — Harness, Dickey & Pierce, P.L.C.

(57) ABSTRACT

Disclosed is a semiconductor package system comprising a substrate, a first semiconductor package on the substrate, and a heat radiation structure on the first semiconductor package. The heat radiation structure includes a first part on a top surface of the first semiconductor package and a second part connected to the first part. The second part has a bottom surface at a level lower than a level of the top surface of the first semiconductor package. A vent hole is provided between an edge region of the substrate and the first part of the heat radiation structure.

19 Claims, 13 Drawing Sheets

(56) References Cited

U.S. PATENT DOCUMENTS

| | | | |
|---|---|---|---|
| 2007/0045835 A1* | 3/2007 | Lin | H01L 23/3114 257/734 |
| 2007/0200225 A1* | 8/2007 | Ibrahim | H01L 23/4334 257/712 |
| 2012/0051017 A1 | 3/2012 | Lee et al. | |
| 2013/0258599 A1* | 10/2013 | Danello | H01L 23/433 361/706 |
| 2014/0340849 A1* | 11/2014 | Kim | H01L 23/36 361/717 |
| 2016/0120039 A1 | 4/2016 | Bang et al. | |
| 2016/0320426 A1 | 11/2016 | Boysel et al. | |
| 2017/0141095 A1 | 5/2017 | Bruno et al. | |
| 2017/0170147 A1 | 6/2017 | Goh et al. | |

FOREIGN PATENT DOCUMENTS

| | | |
|---|---|---|
| JP | 5246133 B2 | 7/2013 |
| JP | 2014-154688 A | 8/2014 |
| KR | 100203932 B1 | 7/1999 |
| KR | 20-2000-0019563 U | 11/2000 |
| KR | 100475079 B1 | 3/2005 |
| KR | 10-2016-0091084 A | 8/2016 |
| WO | WO-99/16128 A1 | 4/1999 |

\* cited by examiner

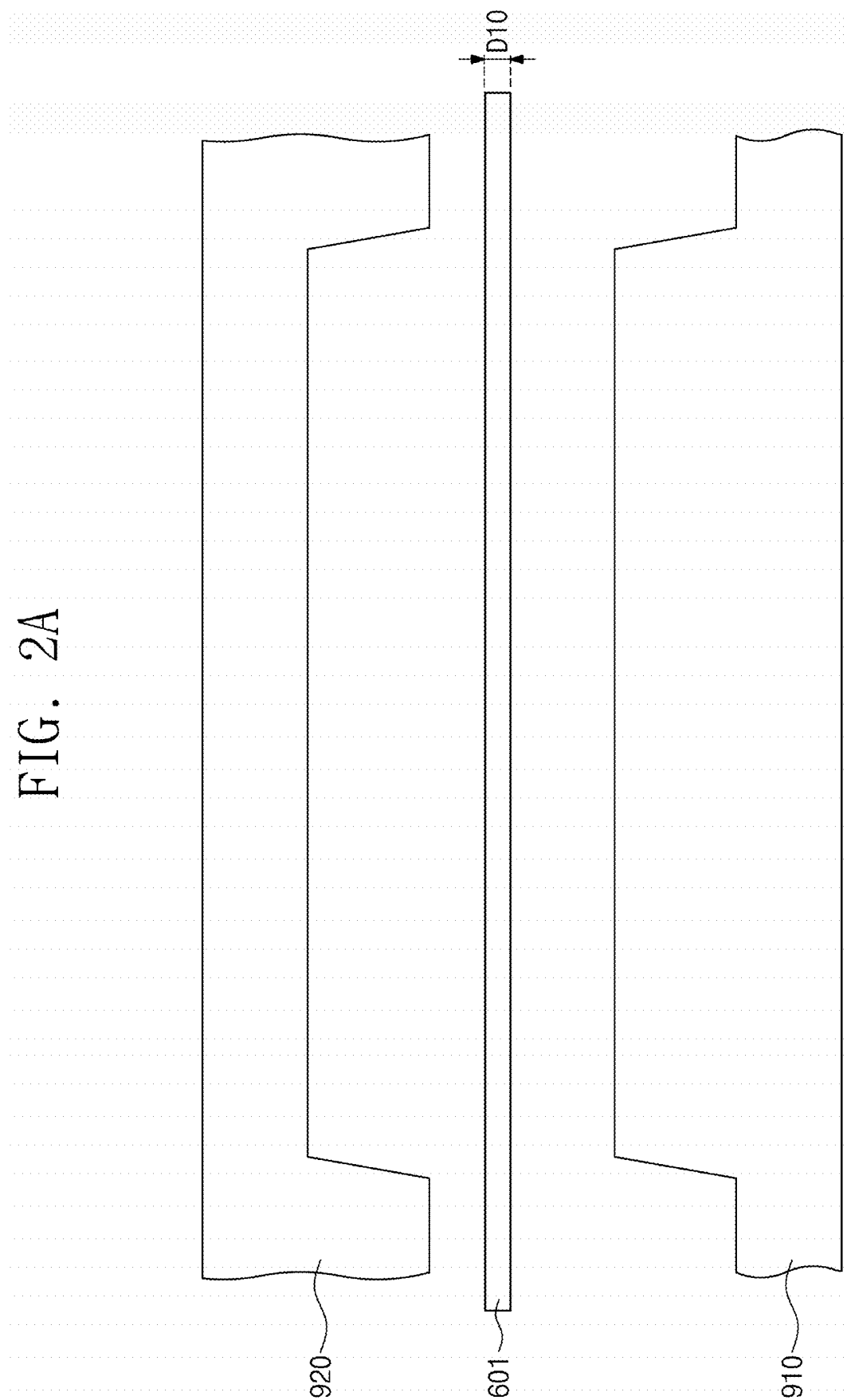

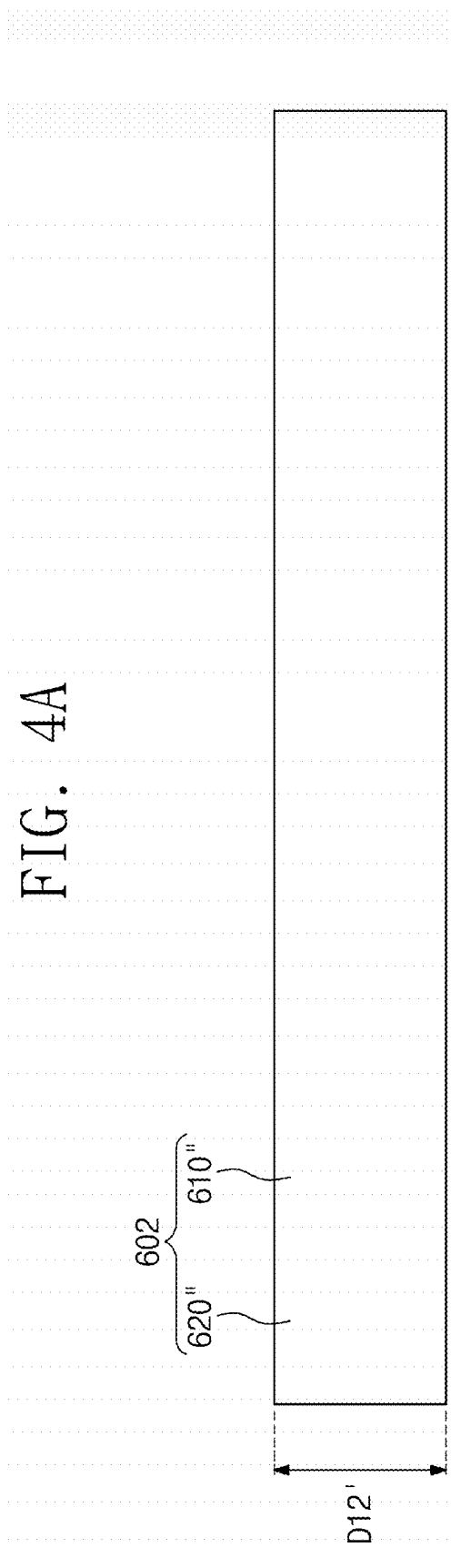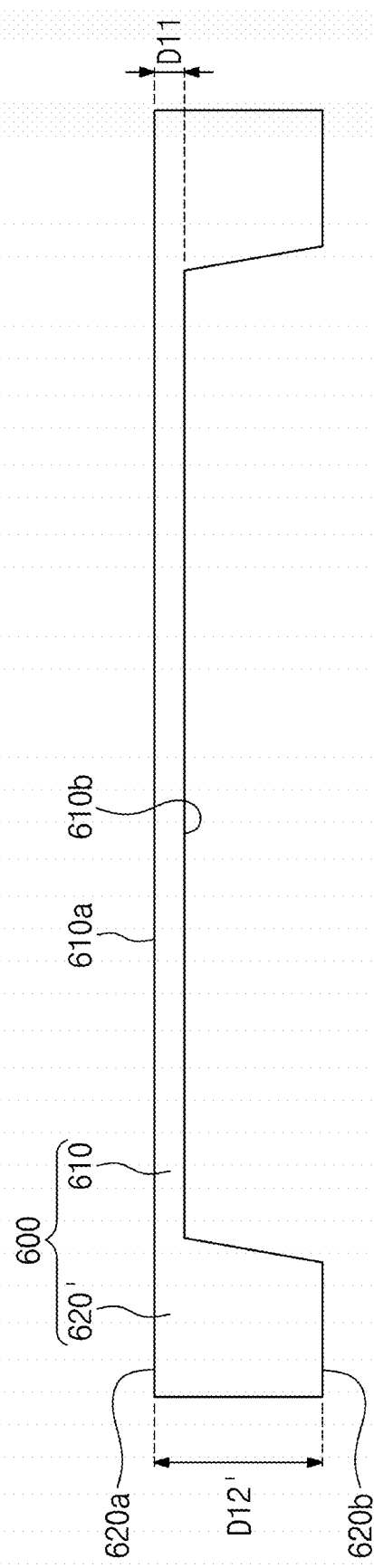

SEMICONDUCTOR PACKAGE SYSTEM

CROSS-REFERENCE TO RELATED APPLICATION

This U.S. nonprovisional application claims priority under 35 U.S.C § 119 to Korean Patent Application Nos. 10-2018-0111677 filed on Sep. 18, 2018 and 10-2019-0054538 filed on May 9, 2019 in the Korean Intellectual Property Office, the entire contents of which are hereby incorporated by reference.

BACKGROUND

The present inventive concepts relate to a package system, and more particularly, to a semiconductor package system including a heat radiation structure.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. The higher speed and capacity of the semiconductor package, the more increase in power consumption of the semiconductor package. Thermal characteristics are increasingly regarded as an important factor in a semiconductor package.

SUMMARY

Some example embodiments of the present inventive concepts provide a semiconductor package system with improved thermal characteristics and a semiconductor module including the same.

According to some example embodiments of the present inventive concepts, a semiconductor package system may comprise: a substrate; a first semiconductor package on the substrate; and a heat radiation structure on the first semiconductor package. The heat radiation structure may include: a first part on a top surface of the first semiconductor package; and a second part connected to the first part, the second part having a bottom surface at a level lower than a level of the top surface of the first semiconductor package. The heat radiation structure may have a vent hole between an edge region of the substrate and the first part of the heat radiation structure.

According to some example embodiments of the present inventive concepts, a semiconductor package system may comprise: a substrate; a heat radiation structure on the substrate, the heat radiation structure including a first part and a second part; a plurality of semiconductor packages between the substrate and the first part of the heat radiation structure, the semiconductor packages being coupled to the substrate; and an adhesive layer between the substrate and the second part of the heat radiation structure. The heat radiation structure may have a vent hole between an edge region of the substrate and the first part of the heat radiation structure.

According to some example embodiments of the present inventive concepts, a semiconductor package system may comprise: a substrate having a central region, a first edge region, and a second edge region; a semiconductor package on the central region of the substrate; and a heat radiation structure on the semiconductor package. The heat radiation structure may include: a first bottom surface in the first edge region of the substrate and the semiconductor package, the first bottom surface being at a level higher than a level of a top surface of the semiconductor package; and a second bottom surface overlapping the second edge region of the substrate, the second bottom surface being at a level lower than a level of the top surface of the semiconductor package. The first and second edge regions of the substrate may be adjacent to a side surface of the substrate.

BRIEF DESCRIPTION OF THE DRAWINGS

FIGS. 2A and 2B illustrate cross-sectional views showing a method of fabricating a heat radiation structure according to some example embodiments.

FIGS. 4A and 4B illustrate cross-sectional views showing a method of fabricating a heat radiation structure according to some example embodiments.

DETAILED DESCRIPTION OF EMBODIMENTS

Figure 1A:
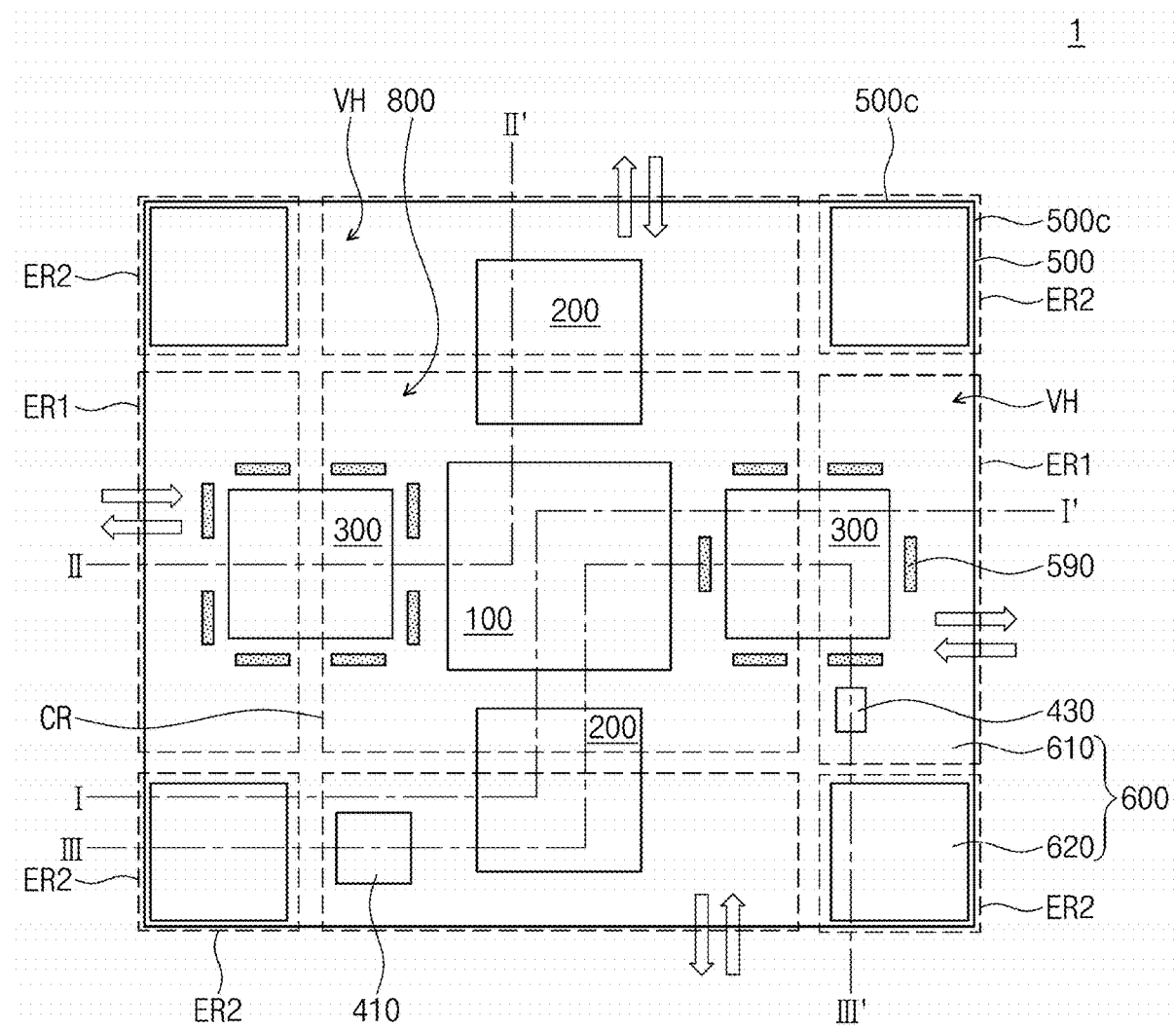
FIG. 1A illustrates a plan view showing a package system according to some example embodiments.

In this description, like reference numerals may indicate like components. The following will now describe a package system and a semiconductor module including the same according to the present inventive concepts. A semiconductor package system may be a package system or a semiconductor module.

Figure 1B:
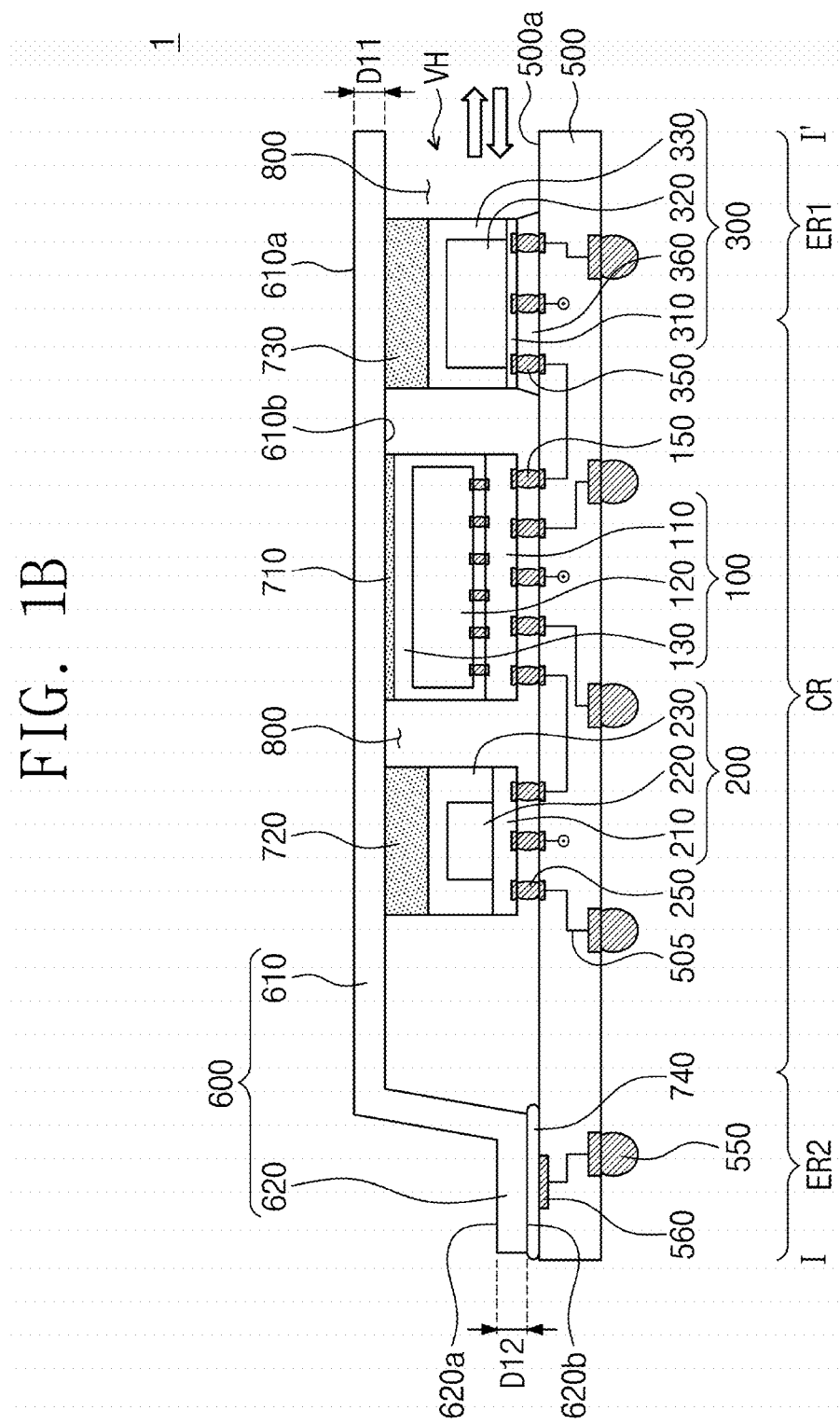
FIG. 1B illustrates a cross-sectional view taken along line I-I' of FIG. 1A.
Figure 1C:
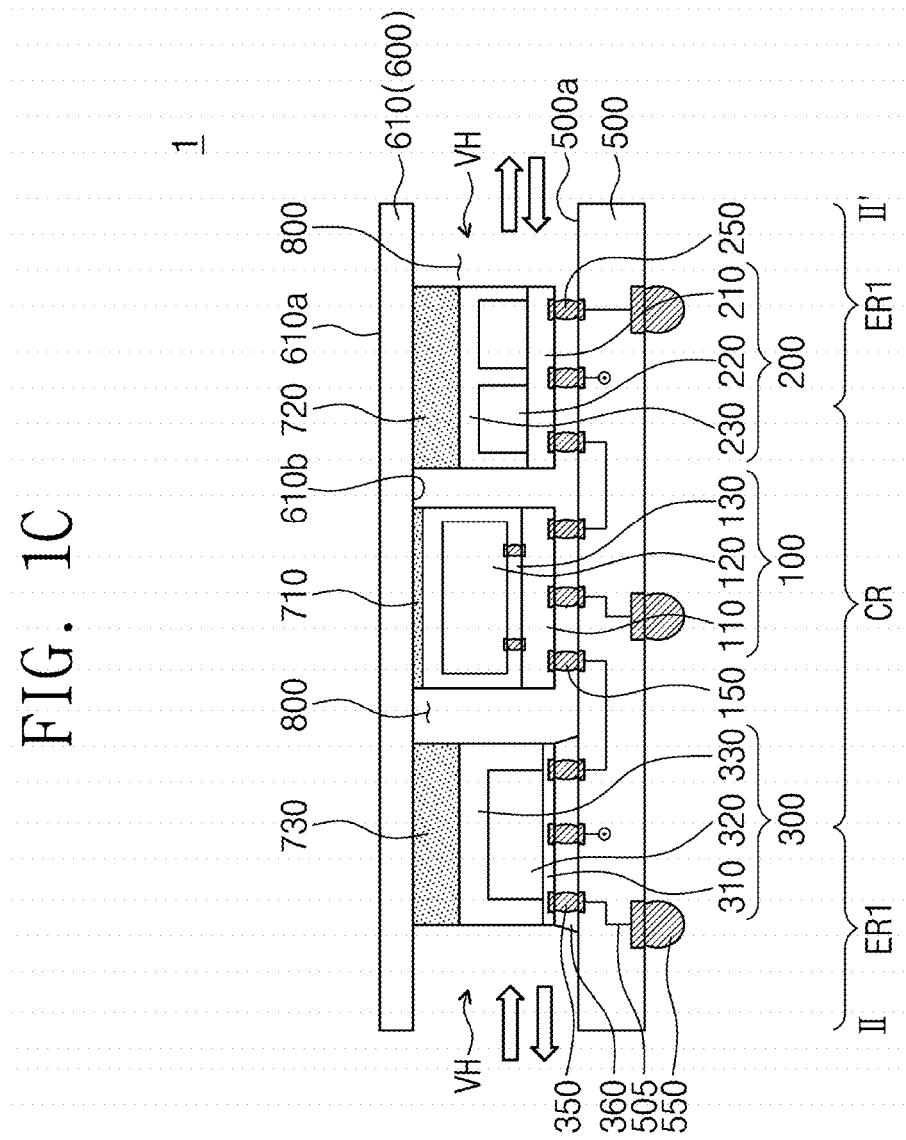
FIG. 1C illustrates a cross-sectional view taken along line II-II' of FIG. 1A.
Figure 1D:
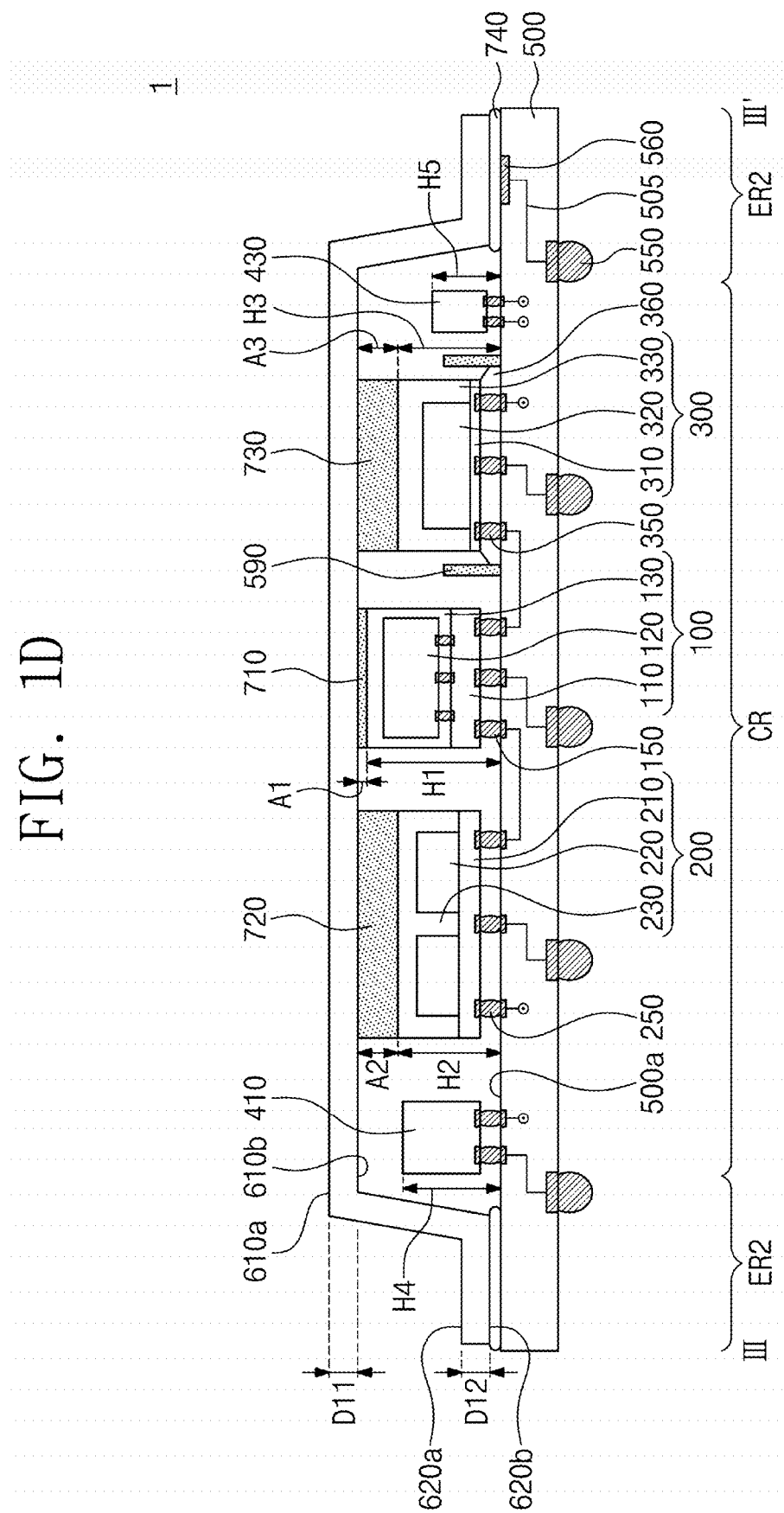
FIG. 1D illustrates a cross-sectional view taken along line III-III' of FIG. 1A.
Figure 1E:
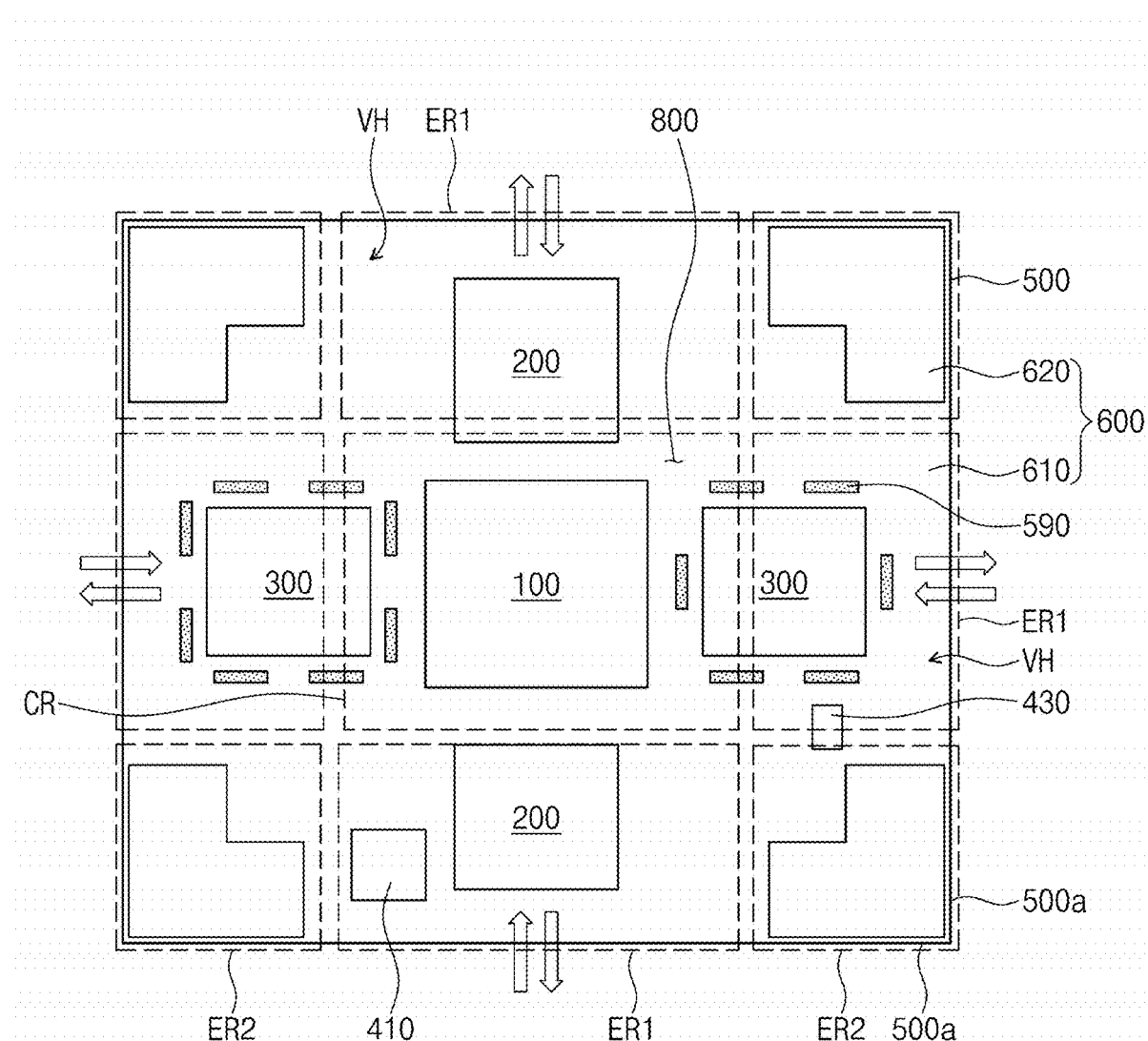
FIG. 1E illustrates a plan view showing a package system according to some example embodiments.

FIG. 1A illustrates a plan view showing a package system according to some example embodiments. FIG. 1B illustrates a cross-sectional view taken along line I-I' of FIG. 1A. FIG. 1C illustrates a cross-sectional view taken along line II-II' of FIG. 1A. FIG. 1D illustrates a cross-sectional view taken along line III-III' of FIG. 1A. FIG. 1E illustrates a plan view showing a package system according to some example embodiments.

Referring to FIGS. 1A, 1B, 1C, and 1D, a package system 1 may include a substrate 500, a first semiconductor package 100, a second semiconductor package 200, a third semiconductor package 300, a heat radiation structure 600, and a first thermal conductive layer 710.

When viewed in plan, the substrate 500 may have a central region CR and edge regions ER1 and ER2. The edge regions ER1 and ER2 of the substrate 500 may include a first edge region ER1 and second edge regions ER2. The first and second edge regions ER1 and ER2 of the substrate 500 may surround the central region CR. The first and second edge regions ER1 and ER2 of the substrate 500 may be closer than the central region CR to side surfaces 500c of the substrate 500. Each of the second edge regions ER2 may correspond to corner regions of the substrate 500. For example, each of the second edge regions ER2 may be adjacent to a corner where two neighboring side surfaces 500c of the substrate 500 meet each other. The first edge region ER1 of the substrate 500 may be provided between the second edge regions ER2 and adjacent to one of the side surfaces 500c of the substrate 500. For example, a printed circuit board (PCB) having a circuit pattern may be used as the substrate 500. Conductive terminals 550 may be provided on a bottom surface of the substrate 500. The conductive terminals 550 may include one or more of a solder ball, a bump, and a pillar. The conductive terminals 550 may include, for example, metal.

A ground pad 560 may be provided on a top surface 500a of the substrate 500. At least one of the conductive terminals 550 may serve as a ground terminal. A ground voltage may be applied to the ground pad 560 through the ground terminal and the substrate 500.

The first semiconductor package 100 may be mounted on the top surface 500a of the substrate 500. When viewed in plan, the first semiconductor package 100 may be disposed on the central region CR of the substrate 500. The first semiconductor package 100 may include a first substrate 110, a first semiconductor chip 120, and a first molding layer 130. A printed circuit board or a redistribution layer may be used as the first substrate 110. The first semiconductor chip 120 may be flip-chip mounted on the first substrate 110. Connection members may be provided between the first semiconductor chip 120 and the first substrate 110. The connection members may include a solder ball, a pillar, a bump, or a ball grid array. The first semiconductor chip 120 may be a system on chip (SOC), a logic chip, or an application processor (AP). The first semiconductor chip 120 may include circuits having different functions. The first semiconductor chip 120 may include two or more of a logic circuit, a memory circuit, a digital integrated circuit (IC), a wireless radio frequency integrated circuit (RFIC), and an input/output circuit. The phrase "heat is generated from the first semiconductor package 100" may mean that "heat is generated from the first semiconductor chip 120".

The molding layer 130 may be provided on the first substrate 110, covering the first semiconductor chip 120. The first molding layer 130 may cover lateral and top surfaces of the first semiconductor chip 120, encapsulating the first semiconductor chip 120. Differently from that shown, the first molding layer 130 may expose the top surface of the first semiconductor chip 120. The first molding layer 130 may include a dielectric polymer, such as an epoxy-based molding compound.

First connection terminals 150 may be interposed between the substrate 500 and the first substrate 110. The first semiconductor package 100 may be electrically connected through the first connection terminals 150 to the substrate 500. In this description, the phrase "electrically connected/coupled to the substrate 500" may mean "electrically connected/coupled to wiring lines 505 in the substrate 500". The first connection terminals 150 may include a solder ball, a pillar, a bump, or a ball grid array. The first semiconductor package 100 mounted on the substrate 500 may have a height (see H1 of FIG. 1D) that is defined to include a height of the first connection terminal 150. For example, the height H1 of the mounted first semiconductor package 100 may be the same as a sum of heights of the first connection terminal 150, the first substrate 110, and the first molding layer 130. In this description, the term "height" may mean "a maximum distance measured in a direction perpendicular to the top surface 500a of the substrate 500". A pitch of the first connection terminals 150 may be less than a pitch of the conductive terminals 550.

The second semiconductor package 200 may be mounted on the top surface 500a of the substrate 500. When viewed in plan, the second semiconductor package 200 may be disposed spaced apart from the first semiconductor package 100. The second semiconductor package 200 may include a second substrate 210, a second semiconductor chip 220, and a second molding layer 230. A printed circuit board or a redistribution layer may be used as the second substrate 210. The second semiconductor chip 220 may be disposed on the second substrate 210. The second semiconductor chip 220 may be of a different type from the first semiconductor chip 120. For example, the second semiconductor package 200 may be of a different type from the first semiconductor package 100. The second semiconductor chip 220 may serve as, for example, a memory chip. The memory chip may include a dynamic random access memory (DRAM) chip. For another example, the memory chip may include a static random access memory (SRAM), a magnetic random access memory (MRAM), and/or a NAND Flash memory. The phrase "heat is generated from the second semiconductor package 200" may mean that "heat is generated from the second semiconductor chip 220". The second semiconductor chip 220 may be electrically connected through bonding wires to the second substrate 210. For another example, the second semiconductor chip 220 may be flip-chip mounted on the second substrate 210. The second semiconductor package 200 may include a plurality of second semiconductor chips 220. Alternatively, the second semiconductor package 200 may include a single second semiconductor chip 220. The second molding layer 230 may cover lateral and top surfaces of the second semiconductor chip 220, encapsulating the second semiconductor chip 220. Differently from that shown, the second molding layer 230 may cover the lateral surface of the second semiconductor chip 220, but expose the top surface of the second semiconductor chip 220. The second molding layer 230 may include a dielectric polymer, such as an epoxy-based molding compound.

Second connection terminals 250 may be interposed between the substrate 500 and the second substrate 210. The second semiconductor package 200 may be electrically connected through the second connection terminals 250 to the substrate 500. The second connection terminals 250 may include a solder ball, a pillar, a bump, or a ball grid array. A pitch of the second connection terminals 250 may be less than the pitch of the conductive terminals 550. The second semiconductor package 200 mounted on the substrate 500 may have a height (see H2 of FIG. 1D) that is defined to include a height of the second connection terminal 250. For example, the height H2 of the mounted second semiconductor package 200 may be the same as a sum of heights of the second connection terminal 250, the second substrate 210, and the second molding layer 230. The height H1 of the mounted first semiconductor package 100 may be greater than the height H2 of the mounted second semiconductor package 200.

The second semiconductor package 200 may be provided in plural. The second semiconductor packages 200 may be disposed spaced apart from each other. As shown in FIG. 1A, the side surfaces 500c of the substrate 500 may include a first side surface and a second side surface that face each other. When viewed in plan, one of the second semiconductor packages 200 may be disposed between the first semiconductor package 100 and the first side surface of the substrate 500, and other one of the second semiconductor packages 200 may be disposed between the first semiconductor package 100 and the second side surface of the substrate 500. The first semiconductor package 100 may be disposed between the second semiconductor packages 200, and thus signal paths may be reduced between the first semiconductor package 100 and the second semiconductor packages 200. In addition, semiconductor packages may improve in electrical characteristics such as signal integrity. The number and planar arrangement of the second semiconductor packages 200 are not limited to that shown in FIG. 1A, but may be variously changed.

The third semiconductor package 300 may be mounted on the substrate 500. When viewed in plan, the third semiconductor package 300 may be disposed spaced apart from the first semiconductor package 100 and the second semiconductor packages 200. The third semiconductor package 300 may include a third substrate 310, a third semiconductor chip 320, and a third molding layer 330. A redistribution layer or a printed circuit board may be used as the third substrate 310. The third semiconductor chip 320 may be flip-chip mounted on the third substrate 310. Connection members may be provided between the third semiconductor chip 320 and the third substrate 310. The connection members may include a solder ball, a pillar, a bump, or a ball grid array. The third semiconductor chip 320 may be of a different type from the first and second semiconductor chips 120 and 220. For example, the third semiconductor package 300 may be of a different type from the first and second semiconductor packages 100 and 200. The third semiconductor chip 320 may include, for example, a power management integrated circuit (PMIC) and may serve as a power management chip. The phrase "heat is generated from the third semiconductor package 300" may mean that "heat is generated from the third semiconductor chip 320". The third molding layer 330 may be provided on the third substrate 310, covering top and lateral surfaces of the third semiconductor chip 320. For another example, the third molding layer 330 may cover the lateral surface of the third semiconductor chip 320, but expose the top surface of the third semiconductor chip 320. The third molding layer 330 may include a dielectric polymer, such as an epoxy-based polymer.

Third connection terminals 350 may be interposed between the substrate 500 and the third substrate 310. The third semiconductor package 300 may be electrically connected through the third connection terminals 350 to the substrate 500. The third connection terminals 350 may include a solder ball, a pillar, a bump, or a ball grid array. A pitch of the third connection terminals 350 may be less than the pitch of the conductive terminals 550. The third semiconductor package 300 mounted on the substrate 500 may have a height (see H3 of FIG. 1D) that is defined to include a height of the third connection terminal 350. For example, the height H3 of the mounted third semiconductor package 300 may be defined as a sum of heights of the third connection terminal 350, the third substrate 310, and the third molding layer 330. The height H1 of the mounted first semiconductor package 100 may be greater than the height H3 of the mounted third semiconductor package 300.

The third semiconductor package 300 may be provided in plural as shown in FIG. 1A. In this case, the third semiconductor packages 300 may be disposed spaced apart from each other. The side surfaces 500c of the substrate 500 may include a third side surface and a fourth side surface that face each other. The third side surface may neighbor the first side surface of the substrate 500. When viewed in plan, one of the third semiconductor packages 300 may be disposed between the first semiconductor package 100 and the third side surface of the substrate 500, and other one of the third semiconductor packages 300 may be disposed between the first semiconductor package 100 and the fourth side surface of the substrate 500. The first semiconductor package 100 may be disposed between the third semiconductor packages 300, and thus signal paths may be reduced between the first semiconductor package 100 and the third semiconductor packages 300. The package system 1 may improve in power integrity. The number and planar arrangement of the third semiconductor packages 300 are not limited to that shown in FIG. 1A, but may be variously changed.

The heat radiation structure 600 may be provided on the first, second, and third semiconductor packages 100, 200, and 300. The heat radiation structure 600 may include a first part 610 and a second part 620.

When viewed in plan, the first part 610 of the heat radiation structure 600 may overlap the central region CR and the first edge region ER1 of the substrate 500. The first part 610 of the heat radiation structure 600 may be provided on top surfaces of the first, second, and third semiconductor packages 100, 200, and 300. The first part 610 of the heat radiation structure 600 may have a first bottom surface 610b and a first top surface 610a that face each other. The first bottom surface 610b of the heat radiation structure 600 may be directed toward the top surfaces of the first, second, and third semiconductor packages 100, 200, and 300. The first bottom surface 610b of the heat radiation structure 600 may be provided at a level the same as or higher than that of the top surfaces of the first, second, and third semiconductor packages 100, 200, and 300. The first bottom surface 610b of the heat radiation structure 600 may be substantially flat. For example, the first bottom surface 610b of the heat radiation structure 600 may be located at substantially same level on the first, second, and third semiconductor packages 100, 200, and 300.

Because the heat radiation structure 600 includes the first part 610, the package system 1 may improve in thermal characteristics. For example, when the package system 1 is operated, heat generated from the first, second, and third semiconductor packages 100, 200, and 300 may be transferred to the first part 610 of the heat radiation structure 600. The heat radiation structure 600 may include a thermal conductive material. The thermal conductive material may include a metallic material (e.g., copper and/or aluminum) or a carbon-containing material (e.g., graphene, graphite, and/or carbon nano-tube). The heat radiation structure 600 may have a relatively high thermal conductivity. For example, a single metal layer or a plurality of stacked metal layers may be used as the heat radiation structure 600. The heat radiation structure 600 may include a heat sink or a heat pipe. Therefore, the first part 610 of the heat radiation structure 600 may promptly discharge heat transferred from the first, second, and third semiconductor packages 100, 200, and 300.

The first thermal conductive layer 710 may be interposed between the first semiconductor package 100 and the first part 610 of the heat radiation structure 600. The first thermal conductive layer 710 may physically contact the top surface of the first semiconductor package 100 and the first bottom surface 610b of the heat radiation structure 600. The first thermal conductive layer 710 may have a thermal conductivity greater than that of air. The first thermal conductive layer 710 may fill a gap between the first semiconductor package 100 and the heat radiation structure 600, and thus heat generated from the first semiconductor package 100 may be rapidly transferred to the heat radiation structure 600. A second thermal conductive layer 720 may be provided between the second semiconductor package 200 and the heat radiation structure 600. The second thermal conductive layer 720 may physically contact the top surface of the second semiconductor package 200 and the first bottom surface 610b of the heat radiation structure 600. Heat generated from the second semiconductor package 200 may be transferred through the second thermal conductive layer 720 to the heat radiation structure 600. A third thermal conductive layer 730 may be provided between the third semiconductor package 300 and the heat radiation structure 600. The third thermal conductive layer 730 may physically contact the top surface of the third semiconductor package 300 and the first bottom surface 610b of the heat radiation structure 600. Heat generated from the third semiconductor package 300 may be transferred through the third thermal conductive layer 730 to the heat radiation structure 600. The first, second, and third thermal conductive layers 710, 720, and 730 may include a thermal interface material (TIM). The thermal interface material may include, for example, a polymer and thermal conductive particles. The thermal conductive particles may be distributed in the polymer.

When viewed in plan, the second part 620 of the heat radiation structure 600 may be spaced apart from the first, second, and third semiconductor packages 100, 200, and 300, and may overlap the second edge region ER2 of the substrate 500. The first and second parts 610 and 620 of the heat radiation structure 600 may be formed into a single body. For example, the first and second parts 610 and 620 of the heat radiation structure 600 may include the same material and be connected without an interface, for example, integral.

As shown in FIGS. 1B and 1D, the second part 620 of the heat radiation structure 600 may have a second bottom surface 620b and a second top surface 620a that face each other. For the heat radiation structure 600, the second bottom surface 620b may be connected to the first bottom surface 610b and provided at a lower level than that of the first bottom surface 610b. The second bottom surface 620b of the heat radiation structure 600 may be provided at a lower level than that of the top surfaces of the first, second, and third semiconductor packages 100, 200, and 300. For the heat radiation structure 600, the second top surface 620a may be connected to the first top surface 610a and provided at a lower level than that of the first top surface 610a. The heat radiation structure 600 may be configured such that a thickness D12 of the second part 620 may be substantially the same as a thickness D11 of the first part 610.

An adhesive layer 740 may be interposed between the substrate 500 and the second part 620 of the heat radiation structure 600. The adhesive layer 740 may physically contact the top surface 500a of the second edge region ER2 of the substrate 500 and the second bottom surface 620b of the heat radiation structure 600. The second part 620 of the heat radiation structure 600 may be attached through the adhesive layer 740 to the substrate 500. Because the heat radiation structure 600 includes the second part 620, the heat radiation structure 600 may be rigidly fixed to the substrate 500. Accordingly, the heat radiation structure 600 may improve in structural stability.

The second part 620 of the heat radiation structure 600 may be provided in plural. Each of the second parts 620 may have a rectangular shape as shown in FIG. 1A. In certain embodiments, planar shapes of the second parts 620 of the heat radiation structure 600 may be adjusted to allow the package system 1 to have a small size. In other embodiments, as shown in FIG. 1E, one of the second parts 620 of the heat radiation structure 600 may have an "L" shape when viewed in plan. Other one of the second parts 620 may have a shape symmetrical to that of the one of the second parts 620. In certain embodiments, planar shapes of the second parts 620 of the heat radiation structure 600 may be adjusted to more stably fix the heat radiation structure 600 to the substrate 500. The planar shapes of the second parts 620 are not limited to that shown in FIGS. 1A and 1E, but may be variously changed. For brevity of description, the following will describe an example having a single second part 620.

In certain embodiments, the heat radiation structure 600 may have an electrical conductivity to shield electromagnetic interference (EMI) of the first, second, and third semiconductor packages 100, 200, and 300. The electromagnetic interference may mean that communication operations of electrical components suffer from disturbance caused by electromagnetic waves emitted or transferred from other electrical components. The heat radiation structure 600 may prevent operations of the first, second, and third semiconductor packages 100, 200, and 300 from interrupting or being interrupted by operations of other packages.

When more than a certain amount of charges are accumulated in the heat radiation structure 600, the charges may flow from the heat radiation structure 600 into other electrical conductive components, which may result in damage to the electrical conductive components. The electrical conductive components may include one or more of integrated circuits and wiring lines in the first, second, and third semiconductor chips 120, 220, and 320, wiring lines in the first, second, and third substrates 110, 210, and 310, the first, second, and third connection terminals 150, 250, and 350, and the wiring lines 505 in the substrate 500. The adhesive layer 740 may contact the ground pad 560 and the second part 620 of the heat radiation structure 600, and include a conductive adhesive material. In this case, a ground voltage may be applied to the heat radiation structure 600 through the ground pad 560 and the adhesive layer 740. The heat radiation structure 600 may thus prevent the package system 1 from being electrically damaged due to electrostatic discharge (ESD). Alternatively, the adhesive layer 740 may include a dielectric adhesive material.

As shown in FIGS. 1A, 1B, and 1C, the first part 610 of the heat radiation structure 600 may be provided on the first edge region ER1 of the substrate 500. The first part 610 of the heat radiation structure 600 may be vertically spaced apart from the top surface 500a of the first edge region ER1 of the substrate 500. A vent hole VH may be provided between the top surface 500a of the first edge region ER1 of the substrate 500 and the first bottom surface 610b of the first part 610 of the heat radiation structure 600.

A cavity 800 may be provided between the substrate 500 and the first part 610 of the heat radiation structure 600. For example, the cavity 800 may be provided between the top surface 500a of the central region CR of the substrate 500 and the first part 610 of the heat radiation structure 600. The cavity 800 may extend onto the first edge region ER1 of the substrate 500. The cavity 800 may expose side surfaces of the first, second, and third semiconductor packages 100, 200, and 300. The cavity 800 may be occupied by gases, such as air. The vent hole VH may be spatially connected to (for example, in fluid communication with) the cavity 800. When the package system 1 is operated, heat generated from the semiconductor packages 100, 200, and 300 may be transferred to air in the cavity 800, and the air may be rapidly discharged outwards through the vent hole VH. FIGS. 1A to 1C show arrows schematically indicating an air flow through the vent hole VH. The vent hole VH may be spatially connected to (for example, in fluid communication with) an external space (for example, an external environment) outside the package system 1. Air of the external space may be introduced through the vent hole VH into the cavity 800. The air of the external space may have a temperature less than that of air in the cavity 800. The air of the external space may quickly cool the semiconductor packages 100, 200, and 300. Accordingly, the package system 1 may improve in thermal characteristics.

When the package system 1 is operated, the first semiconductor package 100 may produce a large amount of heat. For example, the amount of heat generated from the first semiconductor package 100 may be greater than that generated from the second semiconductor package 200, the third semiconductor package 300, and a first passive device 410, respectively. Operating performance of the package system 1 may be influenced more by thermal characteristics of the first semiconductor package 100 than by thermal characteristics of the second and third semiconductor packages 200 and 300. The more enhanced are thermal characteristics of the first semiconductor package 100, the more improved are operating characteristics of the package system 1. Because heat generated from the first semiconductor package 100 is discharged outwards through the vent hole VH, the packages system 1 may improve in operating characteristics. Each of the first, second, and third thermal conductive layers 710, 720, and 730 may have a thermal conductivity less than that of the heat radiation structure 600. As shown in FIG. 1D, a reduction in thickness A1 of the first thermal conductive layer 710 may accelerate discharge of heat generated from the first semiconductor package 100. In certain embodiments, the thickness A1 of the first thermal conductive layer 710 may be the smallest one of thicknesses of thermal conductive layers in contact with the first and second bottom surfaces 610*b* and 620*b* of the heat radiation structure 600. In this case, the thermal conductive layers may include the first, second, and third thermal conductive layers 710, 720, and 730. The thermal conductive layers may further include the adhesive layer 740. The thickness A1 of the first thermal conductive layer 710 may be less than a thickness A2 of the second thermal conductive layer 720 and less than a thickness A3 of the third thermal conductive layer 730. Therefore, heat generated from the first semiconductor package 100 may be promptly transferred to the heat radiation structure 600. In conclusion, the package system 1 may exhibit improved operating characteristics. A thickness A4 of the adhesive layer 740 may be less than the thickness A1 of the first thermal conductive layer 710. Therefore, heat generated from the first semiconductor package 100 may be more rapidly transferred through the first thermal conductive layer 710 to the heat radiation structure 600.

As shown in FIG. 1B, the first semiconductor package 100 may be electrically connected through the wiring lines 505 of the substrate 500 to the second semiconductor package 200, the third semiconductor package 300, and the conductive terminals 550. The second semiconductor package 200 may be electrically connected through the wiring lines 505 of the substrate 500 to the first semiconductor package 100, the third semiconductor package 300, and the conductive terminals 550. The third semiconductor package 300 may be electrically connected through the wiring lines 505 of the substrate 500 to the first semiconductor package 100, the second semiconductor package 200, and the conductive terminals 550.

As shown in FIG. 1D, a first passive device 410 may be mounted on the top surface 500*a* of the substrate 500. When viewed in plan, the first passive device 410 may be disposed spaced apart from the first, second, and third semiconductor packages 100, 200, and 300. The first passive device 410 may include one or more of an inductor, a resistor, and a capacitor. First connection terminal members may further be provided between the substrate 500 and the first passive device 410. The first connection terminal members may include, for example, a solder ball, a pillar, a bump, or a ball grid array. The first passive device 410 mounted on the substrate 500 may have a height H4 that is defined to include a height of the first connection terminal member. The height H4 of the mounted first passive device 410 may be substantially the same as a distance between the top surface 500*a* of the substrate 500 and an uppermost surface of the first passive device 410. Differently from that shown, the first passive device 410 may be provided in plural. The number and planar arrangement of the first passive devices 410 may be variously changed. The following will describe an example having a single first passive device 410.

In certain embodiments, a sum of the height H1 of the mounted first semiconductor package 100 and the thickness A1 of the first thermal conductive layer 710 may be greater than the height H4 of the mounted first passive device 410. Even when the first passive device 410 is provided on the top surface 500*a* of the substrate 500, the first thermal conductive layer 710 may physically contact the first semiconductor package 100 and the heat radiation structure 600.

An electronic device 430 may further be mounted on the top surface 500*a* of the substrate 500. The electronic device 430 may include a real-time clock or an oscillator such as a crystal oscillator. The electronic device 430 and the top surface 500*a* of the substrate 500 may be provided therebetween with one or more conductive connection terminals that electrically connect the electronic device 430 and the substrate 500 to each other. The electronic device 430 mounted on the substrate 500 may have a height H5 that is defined to include a height of the conductive connection terminal. The height H5 of the mounted electronic device 430 may be the same as, for example, a sum of a height of the conductive connection terminal and a height of the electronic device 430 before mounted on the substrate 500. The sum of the height H1 of the mounted first semiconductor package 100 and the thickness A1 of the first thermal conductive layer 710 may be greater than the height H5 of the mounted electronic device 430. Even when the electronic device 430 is provided on the top surface 500*a* of the substrate 500, heat generated from the first semiconductor package 100 may be readily discharged through the first thermal conductive layer 710 to the heat radiation structure 600. Alternatively, the electronic device 430 may not be provided.

An under-fill layer 360 may be provided in a gap between the substrate 500 and the third substrate 310, encapsulating the third connection terminals 350. The under-fill layer 360 may include a dielectric polymer.

As shown in FIG. 1D, a dam structure 590 may further be provided on the top surface 500*a* of the substrate 500. As shown in FIG. 1A, the dam structure 590 may be disposed between the third semiconductor package 300 and the first passive device 410, between the third semiconductor package 300 and the first semiconductor package 100, or between the third semiconductor package 300 and the second semiconductor package 200. The dam structure 590 may be formed of a liquid resin. In certain embodiments, the dam structure 590 and a topmost layer of the substrate 500 may include the same material and be connected without an interface, for example, integral. In other embodiments, the dam structure 590 may include a different material from that of the substrate 500. For example, the dam structure 590 may be formed of the same material as that of the under-fill layer 360. The dam structure 590 may have a height the same as or less than the sum of the height H1 of the mounted first semiconductor package 100 and the height A1 of the first thermal conductive layer 710. The dam structure 590 may prevent the under-fill layer 360 from extending toward a gap between the first semiconductor package 100 and the substrate 500, a gap between the second semiconductor package 200 and the substrate 500, or a gap between the first passive device 410 and the substrate 500. The dam structure 590 may be provided in plural as shown in FIG. 1A. The dam structures 590 may be disposed spaced apart from each other.

The number and arrangement of the dam structures 590 may be variously changed. For example, a first under-fill layer (not shown) may further be provided in a gap between the substrate 500 and the first substrate 110. The dam structures 590 may be provided between the first semiconductor package 100 and the first passive device 410. Alternatively, a second under-fill layer (not shown) may further be provided in a gap between the substrate 500 and the second substrate 210. The dam structures 590 may be provided between the second semiconductor package 200 and the first passive device 410.

Figure 2B:
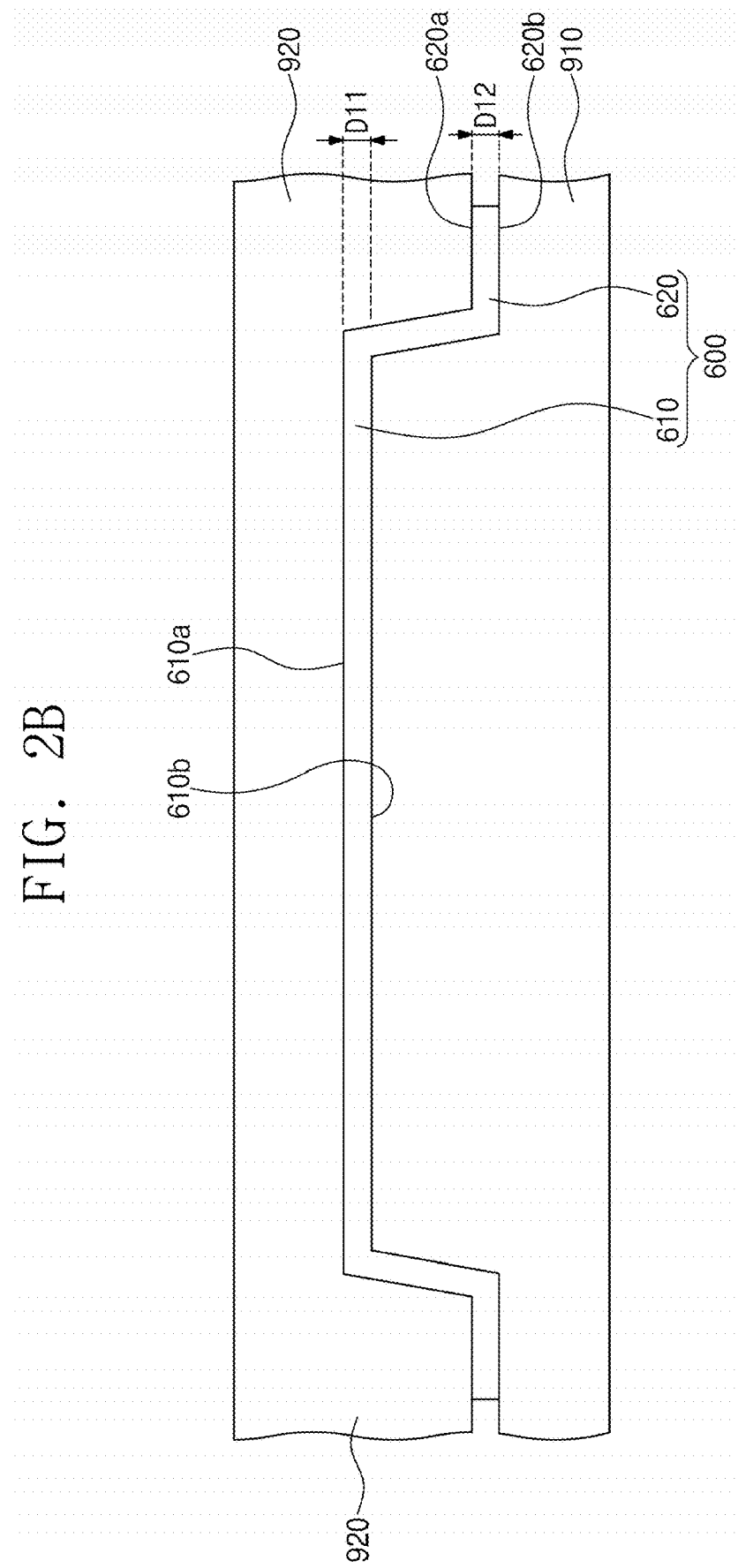

FIGS. 2A and 2B illustrate cross-sectional views showing a method of fabricating a heat radiation structure according to some example embodiments. A duplicate description will be omitted below.

Referring to FIG. 2A, a preliminary heat radiation structure 601 may be prepared. Top and bottom surfaces of the preliminary heat radiation structure 601 may be substantially flat. The preliminary heat radiation structure 601 may have a uniform thickness D10. For example, a metal plate may be used as the preliminary heat radiation structure 601, but the present inventive concepts are not limited thereto.

A press apparatus may be prepared. The press apparatus may include a lower press mold 910 and an upper press mold 920. The preliminary heat radiation structure 601 may be provided between the lower press mold 910 and the upper press mold 920.

Referring to FIG. 2B, the preliminary heat radiation structure 601 may undergo a pressing process in which the lower press mold 910 and the upper press mold 920 are used to form a heat radiation structure 600. The heat radiation structure 600 may have a shape corresponding to a top surface of the lower press mold 910 and a bottom surface of the upper press mold 920. For example, the heat radiation structure 600 may include a first part 610 and a second part 620. The second part 620 of the heat radiation structure 600 may have a thickness D12 substantially the same as a thickness D11 of the first part 610 of the heat radiation structure 600. Afterwards, the heat radiation structure 600 may be separated from the lower press mold 910 and the upper press mold 920. The processes mentioned above may fabricate the heat radiation structure 600 discussed with reference to FIGS. 1A, 1B, and 1C. In certain embodiments, because the pressing process is utilized to fabricate the heat radiation structure 600, the fabrication of the heat radiation structure 600 may be simplified and easily. It may be possible to reduce time and cost in fabricating the heat radiation structure 600.

Figure 3A:
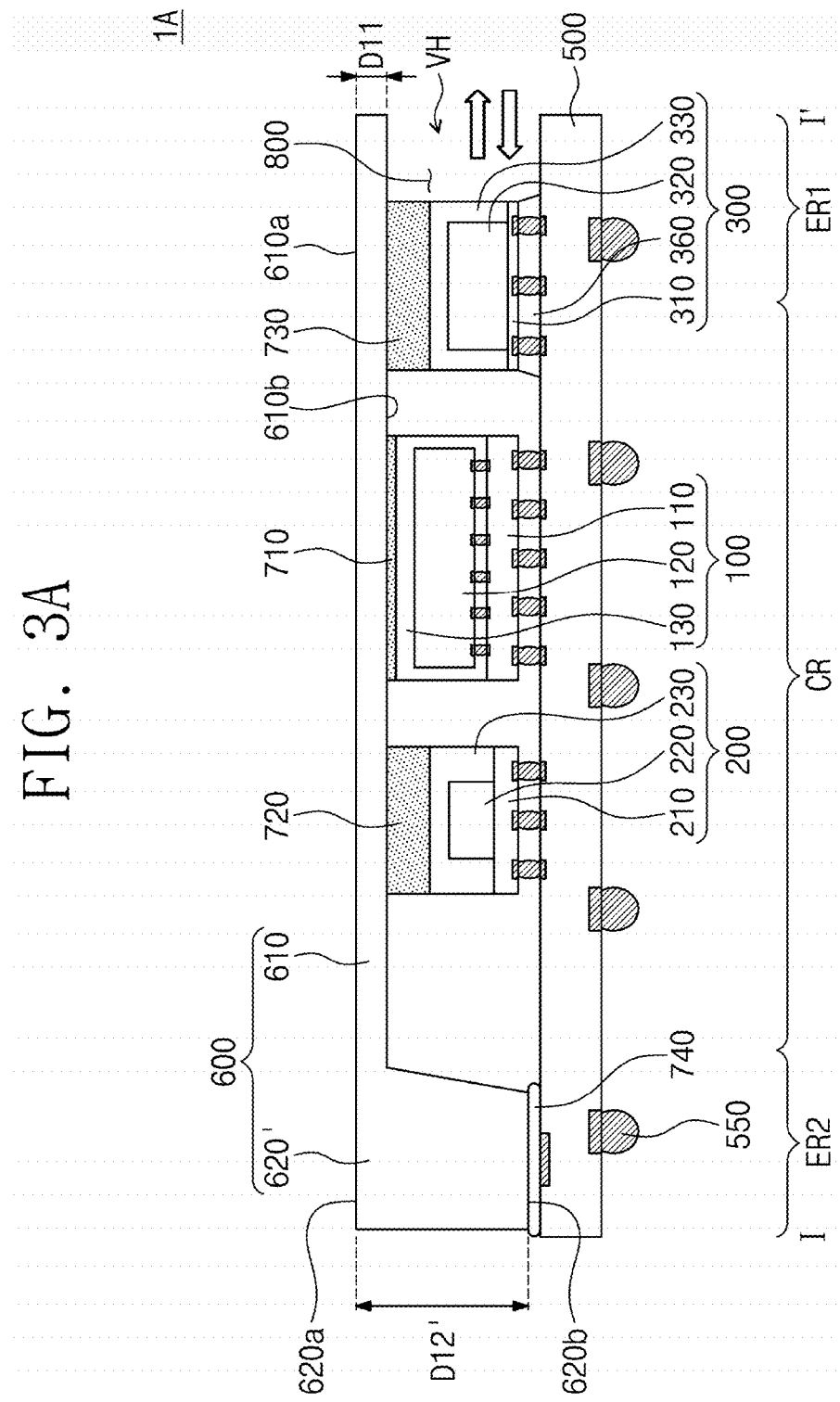
FIGS. 3A to 3C illustrate cross-sectional views showing a package system according to some example embodiments.
Figure 3B:
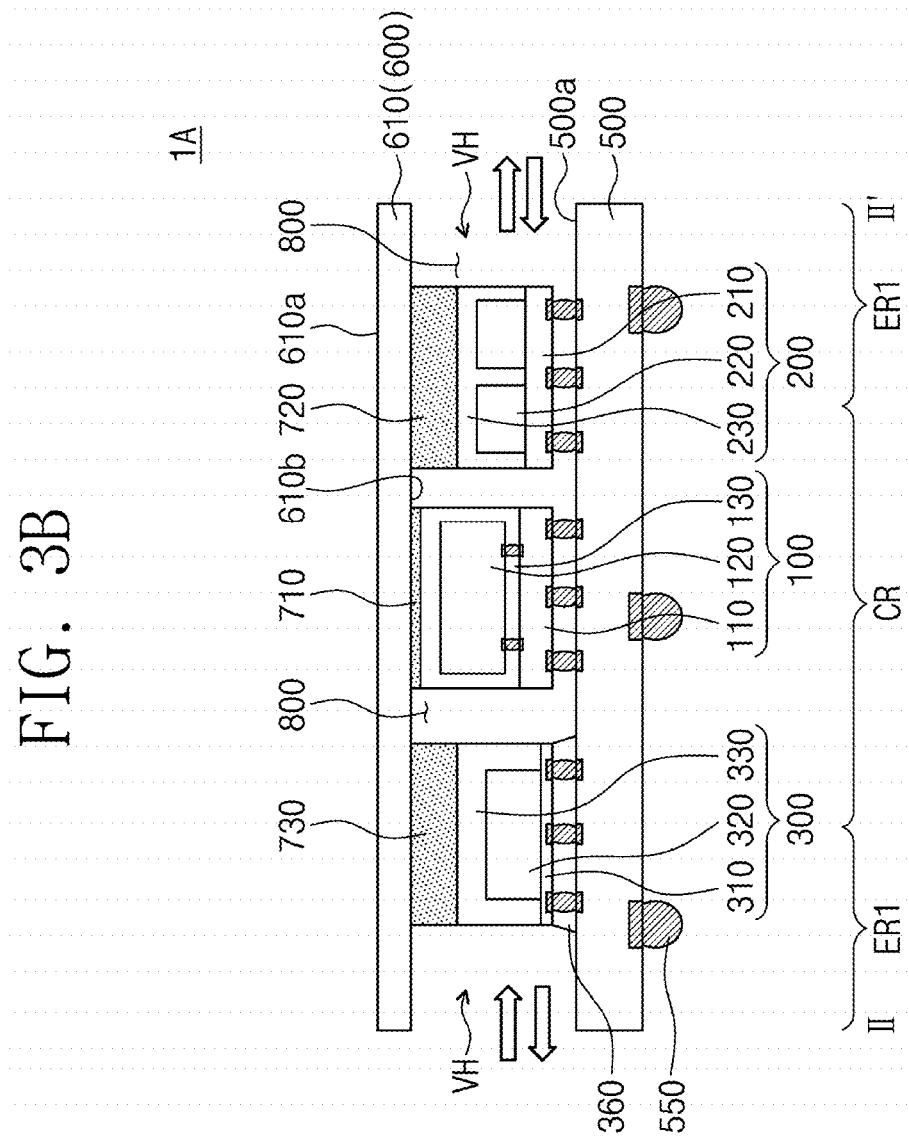
Figure 3C:
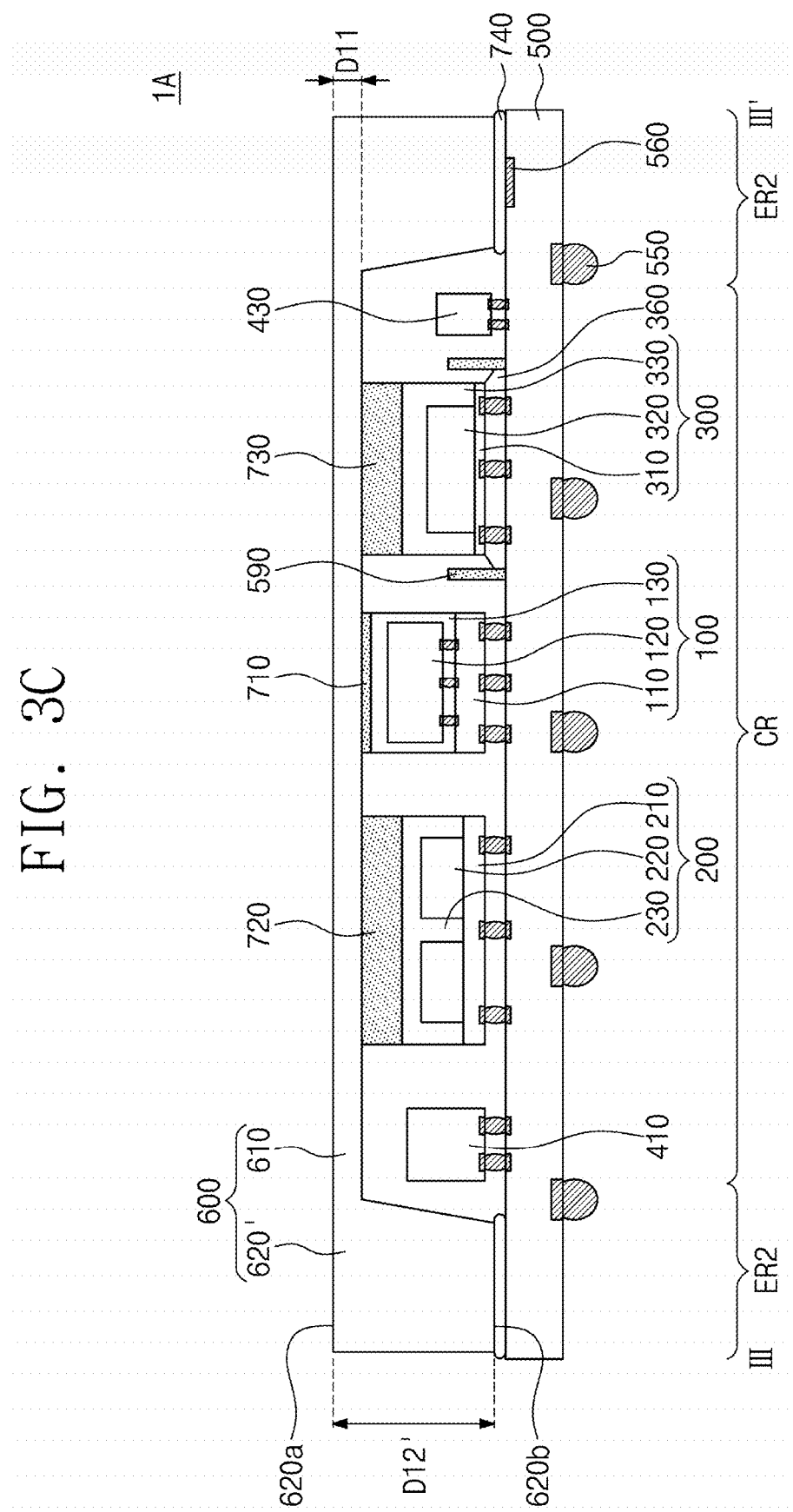

FIGS. 3A to 3C illustrate cross-sectional views showing a package system according to some example embodiments. FIG. 3A corresponds to a cross-section taken along line I-I' of FIG. 1A. FIG. 3B corresponds to a cross-section taken along line II-II' of FIG. 1A. FIG. 3C corresponds to a cross-section taken along line III-III' of FIG. 1A. A duplicate description will be omitted below.

Referring to FIGS. 3A, 3B, and 3C, a package system 1A may include a substrate 500, a first semiconductor package 100, a second semiconductor package 200, a third semiconductor package 300, a heat radiation structure 600, and an adhesive layer 740.

The heat radiation structure 600 may include a first part 610 and a second part 620' that are substantially the same as those discussed above with reference to FIGS. 1A to 1E. The heat radiation structure 600 may have a first bottom surface 610b and a second bottom surface 620b that are substantially the same as those discussed above. In contrast, the heat radiation structure 600 may be configured such that the first part 610 may have a first top surface 610a at substantially the same level of a second top surface 620a of the second part 620'. The top surfaces 610a and 620a of the heat radiation structure 600 may be flat. In this description, the phrase "is flat" may mean that "includes tolerance possibly occurring during fabrication process. The first part 610 of the heat radiation structure 600 may have a thickness D11 less than a thickness D12' of the second part 620' of the heat radiation structure 600.

As shown in FIG. 3C, the substrate 500 may further be provided on its top surface with one or more of a passive device 410, an electronic device 430, and a dam structure 590.

FIGS. 4A and 4B illustrate cross-sectional views showing a method of fabricating a heat radiation structure according to some example embodiments. A duplicate description will be omitted below.

Referring to FIG. 4A, a preliminary heat radiation structure 602 may be prepared. For example, a metal plate may be used as the preliminary heat radiation structure 602. The preliminary heat radiation structure 602 may include a first part 610" and a second part 620". The second part 620" of the preliminary heat radiation structure 602 may have a thickness D12' substantially the same as a thickness of the first part 610" of the preliminary heat radiation structure 602. Top and bottom surfaces of the preliminary heat radiation structure 602 may be substantially flat. For example, the preliminary heat radiation structure 602 may be configured such that a top surface of the second part 620" may be provided at substantially the same level as that of a top surface of the first part 610", and that a bottom surface of the second part 620" may be provided at substantially the same level as that of a bottom surface of the first part 610".

Referring sequentially to FIGS. 4A and 4B, the bottom surface of the preliminary heat radiation structure 602 may be partially recessed to form a heat radiation structure 600 having a first part 610 and a second part 620'. For example, a mechanical technique, such as a milling process, may be performed to recess the bottom surface of the preliminary heat radiation structure 602. The milling process may be performed on the bottom surface of the first part 610" of the preliminary heat radiation structure 602, but not on the bottom surface of the second part 620" of the preliminary heat radiation structure 602. Therefore, the first part 610 of the heat radiation structure 600 may have a first bottom surface 610b provided at a level different from that of a second bottom surface 620b of the second part 620' of the heat radiation structure 600. The first part 610 of the heat radiation structure 600 may have a first top surface 610a at substantially the same level as that of a second top surface 620a of the second part 620' of the heat radiation structure 600. Therefore, the first part 610 of the heat radiation structure 600 may have a thickness D11 less than a thickness D12' of the second part 620' of the heat radiation structure 600. The examples mentioned above may fabricate the heat radiation structure 600 discussed with reference to FIGS. 3A to 3C.

Figure 5A:
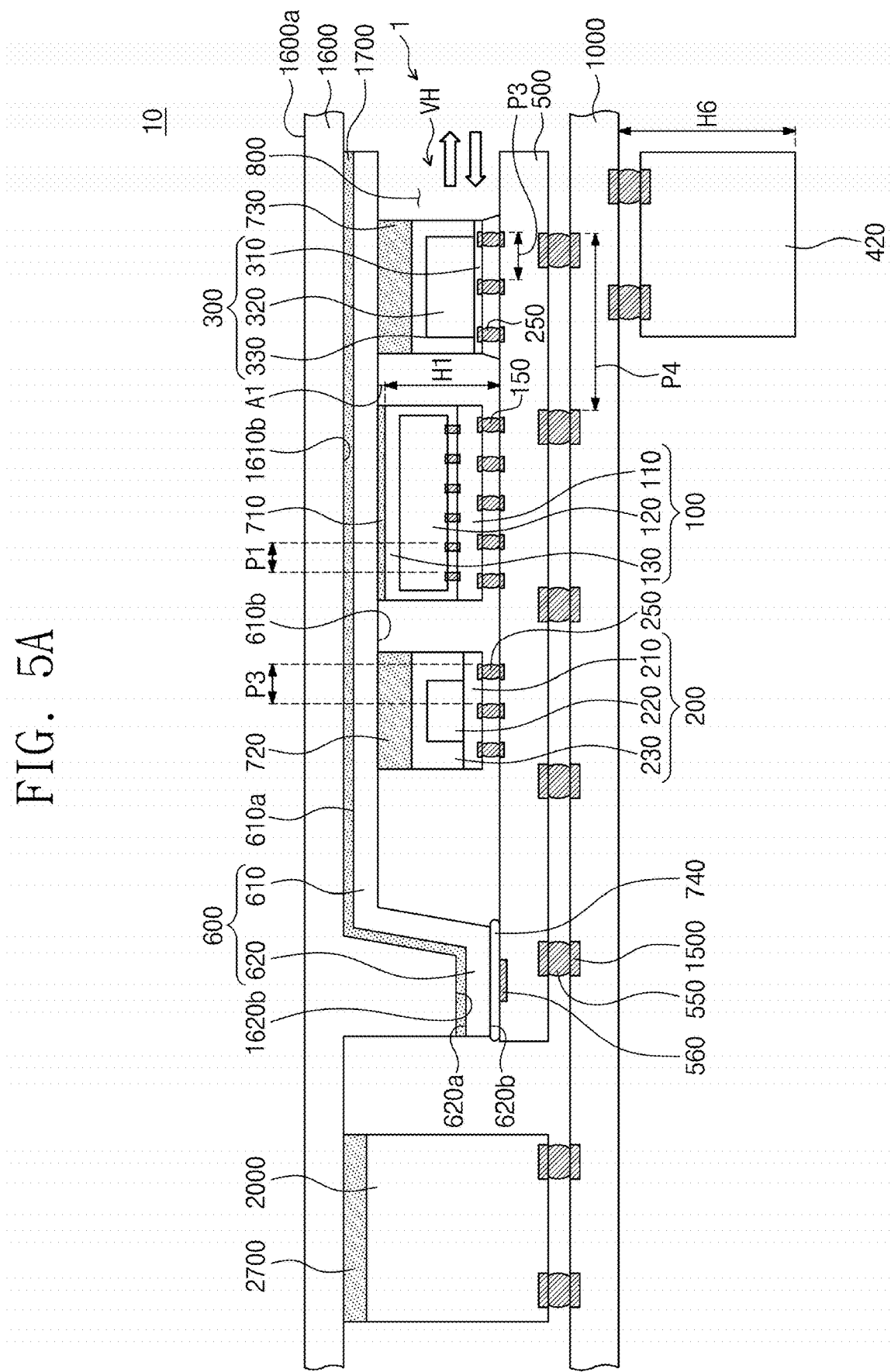
FIG. 5A illustrates a cross-sectional view showing a semiconductor module according to some example embodiments.

FIG. 5A illustrates a cross-sectional view showing a semiconductor module according to some example embodiments. A duplicate description will be omitted below.

Referring to FIG. 5A, a semiconductor module 10 may include a board 1000, a package system 1, and an upper heat radiation structure 1600. For example, a printed circuit board may be used as the board 1000. Conductive pads 1500 may be provided on a top surface of the board 1000. The conductive pads 1500 may be electrically connected to internal wiring lines of the board 1000. In this description, the phrase "electrically connected/coupled to the board 1000" may mean "electrically connected/coupled to the internal wiring lines of the board 1000".

The package system 1 discussed with reference to FIGS. 1A to 1D may be mounted on the board 1000, which may result in the formation of the semiconductor module 10. The mounting of the package system 1 may include providing the package system 1 on the board 1000 to cause the conductive terminals 550 to face the board 1000, and coupling the conductive terminals 550 to the conductive pads 1500. When the heat radiation structure 600 does not include the second part 620, the package system 1 may suffer from warpage in a process in which the package system 1 is mounted. In certain embodiments, the second part 620 of the heat radiation structure 600 and the substrate 500 may be combined to enhance structural stability of the package system 1. Therefore, it may be possible to prevent or reduce warpage of the package system 1 during its mounting.

The upper heat radiation structure 1600 may be provided on the package system 1. For example, the upper heat radiation structure 1600 may be provided on the first and second top surfaces 610a and 620a of the heat radiation structure 600. The upper heat radiation structure 1600 may have a bottom surface including a first lower surface 1610b and a second lower surface 1620b. The first lower surface 1610b of the upper heat radiation structure 1600 may be provided on the first top surface 610a of the heat radiation structure 600, and when viewed in plan, may overlap the first part 610 of the heat radiation structure 600. The second lower surface 1620b of the upper heat radiation structure 1600 may be provided on the second part 620 of the heat radiation structure 600, and when viewed in plan, may overlap the second top surface 620a of the heat radiation structure 600. For the upper heat radiation structure 1600, the second lower surface 1620b may be connected to the first lower surface 1610b and provided at a lower level than that of the first lower surface 1610b. A difference in level between the first and second lower surfaces 1610b and 1620b of the upper heat radiation structure 1600 may be determined by a difference in level between the first and second top surfaces 610a and 620a of the heat radiation structure 600.

The upper heat radiation structure 1600 may have an upper surface 1600a, which is substantially flat. A difference in level between the upper surface 1600a and the second lower surface 1620b of the upper heat radiation structure 1600 may be greater than a difference in level between the upper surface 1600a and the first lower surface 1610b of the upper heat radiation structure 1600. The upper heat radiation structure 1600 may be provided after the package system 1 is mounted.

An upper thermal conductive layer 1700 may be interposed between the heat radiation structure 600 and the upper heat radiation structure 1600, filling a gap between the heat radiation structure 600 and the upper heat radiation structure 1600. The upper thermal conductive layer 1700 may include, for example, a thermal interface material (TIM). When the package system 1 is operated, heat generated from the semiconductor packages 100, 200, and 300 may be transferred to the upper heat radiation structure 1600 through the heat radiation structure 600 and the upper thermal conductive layer 1700.

A semiconductor package 2000 may further be mounted on a top surface of the board 1000. The semiconductor package 2000 may be laterally spaced apart from the package system 1. The upper heat radiation structure 1600 may extend onto the semiconductor package 2000. A fourth thermal conductive layer 2700 may further be interposed between the semiconductor package 2000 and the upper heat radiation structure 1600. Heat generated from the semiconductor package 2000 may be transferred through the fourth thermal conductive layer 2700 to the upper heat radiation structure 1600.

The pitch of the conductive terminals 550 may be substantially the same as a pitch P4 of the conductive pads 1500. The pitch P4 of the conductive pads 1500 may be standardized. For example, the pitch P4 of the conductive pads 1500 may meet JEDEC standard. The pitch P4 of the conductive pads 1500 may be relatively large. For example, the pitch P4 of the conductive pads 1500 may be equal to or greater than about 0.65 mm.

When the first semiconductor package 100, the second semiconductor package 200, and the third semiconductor package 300 are directly mounted on the board 1000, it may be required that each of a first pitch P1 of the first connection terminals 150, a pitch P2 of the second connection terminals 250, and a pitch P3 of the third connection terminals 350 should be substantially the same as the pitch P4 of the conductive pads 1500. In certain embodiments, the first, second, and third semiconductor packages 100, 200, and 300 may be coupled through the substrate 500 to the board 1000. Therefore, each of the first pitch P1 of the first connection terminals 150, the pitch P2 of the second connection terminals 250, and the pitch P3 of the third connection terminals 350 may be freely designed without being restricted by the pitch P4 of the conductive pads 1500.

The pitch P1 of the first connection terminals 150 may be less than the pitch P4 of the conductive pads 1500. For example, the pitch P1 of the first connection terminals 150 may be equal to or less than about 0.4 mm. Thus, the first connection terminals 150 may be more densely provided to reduce a planar area of the first semiconductor package 100. Each of the pitch P2 of the second connection terminals 250 and the pitch P3 of the third connection terminals 350 may be less than the pitch P4 of the conductive pads 1500. For example, each of the pitch P2 of the second connection terminals 250 and the pitch P3 of the third connection terminals 350 may be equal to or less than about 0.4 mm. Thus, the second and third semiconductor packages 200 and 300 may become compact-sized. Because the first, second, and third semiconductor packages 100, 200, and 300 become compact-sized, reduced distances may be provided between the first, second, and third semiconductor packages 100, 200, and 300. Therefore, it may be possible to decrease electrical paths between the first, second, and third semiconductor packages 100, 200, and 300. As a result, the package system 1 may increase in operating speed and reliability.

A second passive device 420 may further be mounted on a bottom surface of the board 1000. Second connection terminal members may further be provided between the board 1000 and the second passive device 420. The second passive device 420 may be coupled through the second connection terminal members to the board 1000. The second connection terminal members may include, for example, a solder ball, a pillar, a bump, or a ball grid array. The second passive device 420 mounted on the board 1000 may have a height H6 that is defined to include a height of the second connection terminal member. The height H6 of the mounted second passive device 420 may be substantially the same as a distance between the bottom surface of the board 1000 and a lowermost surface of the second passive device 420. The height H6 of the mounted second passive device 420 may be greater than the sum of the height H1 of the mounted first semiconductor package 100 and the thickness A1 of the first thermal conductive layer 710. Even though the height H6 of the mounted second passive device 420 is large, the second passive device 420 may be electrically connected through the substrate 500 to the package system 1.

The second passive device 420 may be electrically connected to one of the first, second, and third semiconductor packages 100, 200, and 300. When viewed in plan, the second passive device 420 may overlap or be adjacent to the one of the first, second, and third semiconductor packages 100, 200, and 300. Therefore, an electrical path may be reduced between the second passive device 420 and the one of the first, second, and third semiconductor packages 100, 200, and 300. The semiconductor module 10 may thus improve in electrical characteristics.

Although not shown, the second passive device 420 may be provided in plural. In this case, the heights H6 of the second passive devices 420 may be the same as each other or different from each other.

Figure 5B:
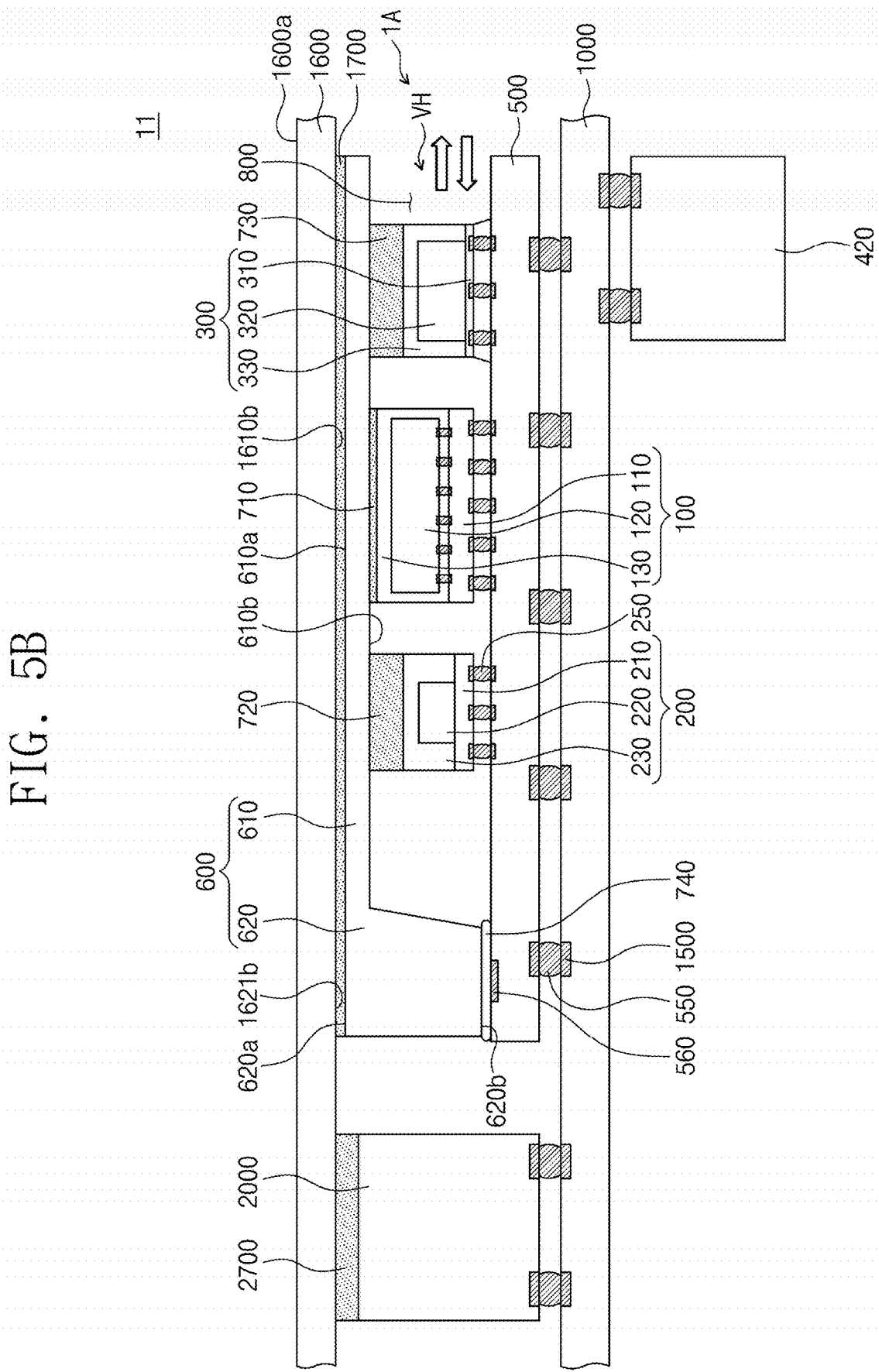
FIG. 5B illustrates a cross-sectional view showing a semiconductor module according to some example embodiments.

FIG. 5B illustrates a cross-sectional view showing a semiconductor module according to some example embodiments. A duplicate description will be omitted below.

Referring to FIG. 5B, a semiconductor module 11 may include the board 1000, the package system 1A, and the upper heat radiation structure 1600.

The formation of the semiconductor module 11 may include mounting the package system 1A of FIGS. 3A to 3C on the board 1000, and providing the heat radiation structure 600 on the package system 1A. The mounting of the package system 1A and the providing of the heat radiation structure 600 may be substantially the same as that discussed with reference to FIG. 5A. In contrast, the upper heat radiation structure 1600 may have a second lower surface 1620*b* at substantially the same level as that of the first lower surface 1610*b*.

The upper thermal conductive layer 1700 may further be interposed between the heat radiation structure 600 and the upper heat radiation structure 1600. The upper heat radiation structure 1600 may extend onto a top surface of the semiconductor package 2000. The semiconductor package 2000 and the second passive device 420 may further be provided on the top and bottom surfaces of the board 1000.

According to the present inventive concepts, a heat radiation structure may include a first part and a second part. The second part of the heat radiation structure may be rigidly fixed to a substrate, and thus a package system may improve in structural stability. A vent hole may be provided between a first edge region of the substrate and the first part of the heat radiation structure. Heat generated from semiconductor packages may be discharged through the vent hole to an external space outside the package system. Air of the external space may be introduced through the vent hole into a cavity of the package system, cooling the semiconductor packages. Accordingly, the package system may improve in thermal characteristics.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A semiconductor package system, comprising:
   a substrate having a first edge region and a second edge region;
   a first semiconductor package on the substrate; and
   a heat radiation structure on the first semiconductor package,
   wherein the heat radiation structure includes:
      a first part on a top surface of the first semiconductor package in the first edge region; and
      a second part connected to the first part, the second part in the second edge region, the second part having a bottom surface at a level lower than a level of the top surface of the first semiconductor package, the heat radiation structure having a vent hole between the first edge region of the substrate and the first part of the heat radiation structure, the vent hole being in fluid communication with an external space, and configured to transfer air based on operation of the semiconductor package system,
   wherein the first and second edge regions of the substrate are adjacent to an outer side surface of the substrate, the heat radiation structure terminating in the first and second edge regions.

2. The semiconductor package system of claim 1, wherein the heat radiation structure further has a cavity between a central region of the substrate and the first part of the heat radiation structure, a side surface of the first semiconductor package is exposed to the cavity, and the vent hole is connected to the cavity.

3. The semiconductor package system of claim 2, further comprising a second semiconductor package on the substrate,
   wherein a side surface of the second semiconductor package is exposed to the cavity.

4. The semiconductor package system of claim 1, further comprising an adhesive layer between the substrate and the second part of the heat radiation structure.

5. The semiconductor package system of claim 1, wherein the vent hole is connected to an external environment.

6. The semiconductor package system of claim 1, wherein
   the bottom surface of the second part of the heat radiation structure is at a level lower than a level of a bottom surface of the first part, and
   a top surface of the second part of the heat radiation structure is at a level lower than a level of a top surface of the first part.

7. The semiconductor package system of claim 6, wherein the second part of the heat radiation structure includes a material the same as a material of the first part, the second part and the first part being connected without an interface.

8. The semiconductor package system of claim 1, wherein a thickness of the second part of the heat radiation structure is greater than a thickness of the first part.

9. A semiconductor package system, comprising:
a substrate having a first edge region, and a second edge region;
a heat radiation structure on the substrate, the heat radiation structure including a first part on the first edge region and a second part on the second edge region;
a plurality of semiconductor packages between the substrate and the first part of the heat radiation structure, the semiconductor packages being coupled to the substrate; and
an adhesive layer between an upper surface of the substrate and a bottom surface of the second part of the heat radiation structure, the heat radiation structure having a vent hole between an edge region of the substrate and the first part of the heat radiation structure,
wherein the adhesive layer is spaced apart from the plurality of semiconductor packages,
wherein the first and second edge regions of the substrate are adjacent to an outer side surface of the substrate, the heat radiation structure terminating in the first and second edge regions.

10. The semiconductor package system of claim 9, wherein the bottom surface of the second part of the heat radiation structure is at a level lower than a level of a bottom surface of the first part of the heat radiation structure, and
wherein the vent hole being in fluid communication with an external space, and configured to transfer air based on operation of the semiconductor package system.

11. The semiconductor package system of claim 9, wherein the heat radiation structure further has a cavity between a central region of the substrate and the first part of the heat radiation structure, the cavity being connected to the vent hole.

12. The semiconductor package system of claim 11, wherein side surfaces of the semiconductor packages are exposed to the cavity.

13. The semiconductor package system of claim 9, further comprising an upper heat radiation structure on the heat radiation structure,
wherein the upper heat radiation structure includes:
a first lower surface on a top surface of the first part of the heat radiation structure; and
a second lower surface on a top surface of the second part of the heat radiation structure, the second lower surface being at a level lower than a level of the first lower surface.

14. The semiconductor package system of claim 9, wherein the semiconductor packages include:
a first semiconductor package on a central region of the substrate, the first semiconductor package including a system on chip;
a second semiconductor package apart from a first side surface of the first semiconductor package, the second semiconductor package including a memory chip; and
a third semiconductor package apart from a second side surface of the first semiconductor package, the third semiconductor package including a power management chip.

15. The semiconductor package system of claim 14, further comprising:
a first thermal conductive layer between the first semiconductor package and the first part of the heat radiation structure; and
a second thermal conductive layer between the second semiconductor package and the first part of the heat radiation structure,
wherein the first thermal conductive layer has a thickness less than a thickness of the second thermal conductive layer.

16. A semiconductor package system, comprising:
a substrate having a central region, a first edge region, and a second edge region;
a semiconductor package on the central region of the substrate; and
a heat radiation structure on the semiconductor package,
wherein the heat radiation structure includes:
a first bottom surface in the first edge region of the substrate and the semiconductor package, the first bottom surface being at a level higher than a level of a top surface of the semiconductor package, the first bottom surface being a bottommost surface of the heat radiation structure in the first edge region; and
a second bottom surface overlapping the second edge region of the substrate, the second bottom surface being at a level lower than a level of the top surface of the semiconductor package, the second bottom surface being a bottommost surface of the heat radiation structure in the second edge region, and
wherein the first and second edge regions of the substrate are adjacent to an outer side surface of the substrate, the heat radiation structure terminating in the first and second edge regions.

17. The semiconductor package system of claim 16, wherein the heat radiation structure has a vent hole between the first edge region of the substrate and the first bottom surface of the heat radiation structure, the vent hole being in fluid communication with an external space, and configured to transfer air based on operation of the semiconductor package system.

18. The semiconductor package system of claim 16, wherein the heat radiation structure further includes:
a first top surface opposite the first bottom surface on the heat radiation structure; and
a second top surface opposite the second bottom surface on the heat radiation structure, the second top surface being connected to the second bottom surface,
wherein the second top surface is at a level lower than a level of the first top surface.

19. The semiconductor package system of claim 16, further comprising an adhesive layer between the second edge region of the substrate and the second bottom surface of the heat radiation structure.

* * * * *